United States Patent [19]

Rapp

[11] Patent Number: 4,464,590
[45] Date of Patent: Aug. 7, 1984

[54] MEMORY SYSTEM CURRENT SENSE AMPLIFIER CIRCUIT

[75] Inventor: A. Karl Rapp, Los Gatos, Calif.

[73] Assignee: National Semiconductor Corporation, Santa Clara, Calif.

[21] Appl. No.: 391,254

[22] Filed: Jun. 23, 1982

[51] Int. Cl.[3] .................... H03K 5/153; H03K 5/08; H03K 19/017; G11C 7/06

[52] U.S. Cl. .................... 307/530; 307/450; 307/557; 307/568; 307/279; 365/189

[58] Field of Search .............. 307/264, 279, 354, 362, 307/448, 450, 530, 557, 558, 559, 561, 568; 365/189, 205; 377/58, 60

[56] References Cited

U.S. PATENT DOCUMENTS

| | | | |
|---|---|---|---|
| 3,648,071 | 3/1972 | Mrazek | 307/530 |
| 4,039,860 | 8/1977 | Lambrechtse et al. | 307/362 |
| 4,239,994 | 12/1980 | Stewart | 307/279 X |
| 4,348,601 | 9/1982 | Kitamura | 307/530 |
| 4,388,541 | 6/1983 | Giebel | 307/530 |

OTHER PUBLICATIONS

Boonstra et al, "A 4096-b One-Transistor Per Bit RAM with Internal Timing and Low Dissipation", IEEE-JSSC, vol. SC-8, No. 5, pp. 305-310; 10/73.
Chakravarti et al, "High Gain Sense Amplifier", IBM Tech. Discl. Bull.; vol. 20, No. 7, pp. 2607-2608, 12/1977.
Schuster, "Sense Amplifier", vol. 19, No. 2, pp. 710-713, 7/1976; IBM Tech. Discl. Bull.
Surgent, "Insulated Gate Field-Effect Transistor Sense Amplifier Latch", IBM Tech. Discl. Bull.; vol. 13, No. 9, pp. 2670-2671; 2/71.

Primary Examiner—Larry N. Anagnos
Attorney, Agent, or Firm—Gail W. Woodward; Paul J. Winters; Michael J. Pollock

[57] ABSTRACT

A current responsive sense amplifier circuit is used in a semiconductor memory. The circuit includes means for reducing the voltage swings that are associated with the binary logic states.

5 Claims, 3 Drawing Figures

MEMORY SYSTEM CURRENT SENSE AMPLIFIER CIRCUIT

BACKGROUND OF THE INVENTION

Semiconductor memory systems employ a plurality of memory cells arranged in columns and rows in accordance with a particular architecture selected. The columns and rows are addressed by means of decoder circuits that can select a particular cell for programming and/or readout. Typically, an integrated circuit (IC) chip will contain the circuit components and the required interconnections. When a large array is located on a chip, it is found that the wiring that interconnects the memory cells involves substantial shunt capacitance. When readout of the memory is accomplished, the sense amplifier will be associated with this shunt capacitance and if voltage readout is accomplished, the capacitance will have to be charged and/or discharged to produce the voltage change to be sensed. It has been found that as array size is increased, the memories are slower to an extent that their performance is compromised. It has also been found that if a current sense amplifier is employed and the voltage changes restricted, the shunt capacitance will not appreciably slow the sensing operation. Therefore, the memory access is substantially speeded up, particularly in large arrays. Clearly any current sense amplifier that acts to restrict the voltage swing will enhance the speed of response.

SUMMARY OF THE INVENTION

It is an object of the invention to reduce the voltage swings at the input to a current sensing amplifier.

This is accomplished in a circuit that operates as follows. An input terminal is coupled to an inverting amplifier stage that produces a substantial output voltage swing. The input voltage is clamped by means of an inverter guide which has its output shorted to its input so as to clamp the input voltage at the inverter trip point. The trip point is designed to be slightly above the trip point of the input inverter stage. The input inverter is connected to drive a high gain noninverting amplifier which provides the desired circuit output voltage swings. A feedback transistor is coupled between the output of the noninverting amplifier and the sense input terminal. Therefore, when the input is zero, the output will be low and the input will be clamped at the shorted gate trip point. When a logic one current is applied to the input and the output goes high, the feedback loop will act to reduce the input voltage swing to a very low value.

BRIEF DESCRIPTON OF THE DRAWING

DESCRIPTION OF THE PRIOR ART

Figure 1:
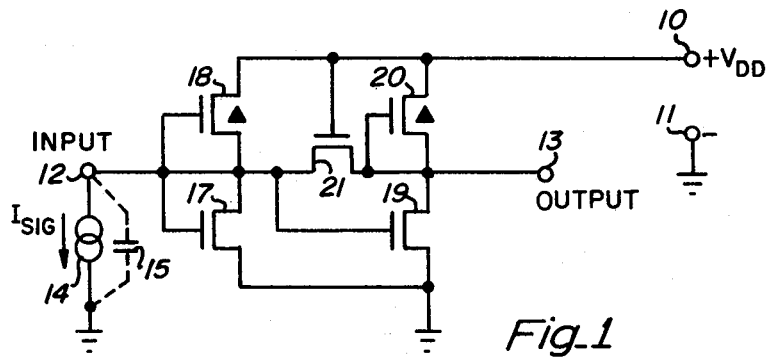
FIG. 1 is a schematic diagram of a prior art current sense amplifier.

FIG. 1 is a schematic diagram of a current sense amplifier heretofore used in the prior art. A $V_{DD}$ power supply is connected + to terminal 10 and − to ground terminal 11. All of the transistors are therefore N channel devices. It is to be understood that P channel devices can be used if the supply polarity is reversed. The object of the circuit is to reduce the voltage swing at input terminal 12 and to provide a suitable output voltage swing at terminal 13 in response to the sensing of a memory current represented by current sink 14. Memory arrays involve a shunt capacitance illustrated at 14. Since large arrays present a relatively large capacitance, a reduced voltage swing means that there is reduced delay caused by charging and discharging that capacitance. Such current sensing improves the speed of response of the memory sense amplifier.

Enhancement transistor 17 with depletion load 18 forms an inverter gate which has its output shorted to its input to as to be at its trip point. Enhancement transistor 19 with depletion load 20 forms an inverter gate and is designed to have a slightly lower trip point then the gate associated with transistor 17. Thus, in the absence of input signal, a logic "zero", the voltage drop across transistor 17 will turn transistor 19 on and output terminal 13 will be low or close to ground.

In the presence of a logic "one", sink 14 will conduct $I_{SIG}$ (which is typically about 50 microamperes) and will act to pull terminal 12 down. This will reduce conduction in transistor 19 so that transistor 20 will pull terminal 13 up toward $+V_{DD}$. Transistor 21 acts as a negative feedback path around inverter transistor 19 to limit gain and optimize bias. This feedback, in effect, softens the transfer function of the inverter gate.

The circuit reduces the input voltage swing but requires a compromise. If depletion load transistor 18 is made too conductive, it will overpower $I_{SIG}$ and prevent terminal 12 from dropping adequately in response to a logic "one". However, if transistor 18 is not conductive enough it will not pull terminal 12 up rapidly enough when encountering a logic "one" to "zero" transition and response speed is lost. When the devices are optimized to properly respond to the required $I_{SIG}$ range, the typical voltage swing at terminal 12 is in the 0.6 to 0.8 volt range. Thus while the voltage swing is small, it is still appreciable.

DESCRIPTON OF THE INVENTION

Figure 2:
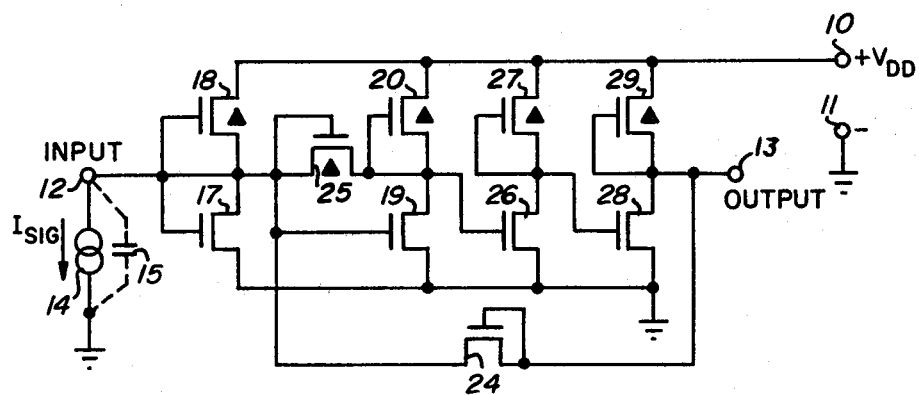
FIG. 2 is a schematic diagram of the circuit of the invention.

The schematic diagram of FIG. 2 shows the sense amplifier of the invention. Where similar elements are employed the same numbers are used. Elements 10 through 20 are the same in FIG. 2 as they were in FIG. 1 and function in substantially the same manner.

However, enhancement transistor 21 of FIG. 1 has been replaced by a depletion device 25. This device provides the negative feedback around transistor 19 and its conduction is not dependent upon the $V_{DD}$ magnitude.

Transistor 24 is coupled from output terminal 13 back to input terminal 12 to provide an overall negative feedback loop. The circuit includes a pair of cascaded inverters composed of enhancement transistors 26 and 28 with their depletion load transistors 27 and 29. These inverters act to provide a high loop gain. In the logic "zero" state, where terminal 12 is high, terminal 13 will be low. Since transistor 24 is below its threshold there will be no feedback.

In the logic "one" state, terminal 13 is driven towards $V_{DD}$. When it rises to a level one threshold of an enhancement transistor above the trip voltage of transistor 17, transistor 24 will turn on and the thus produced negative feedback will hold the circuit at that level. Using this configuration will limit the voltage swings at terminal 12 to in the range of 20 to 0 millivolts. This represents an improvement of 20:1 to 30:1 over the prior art.

Figure 3:
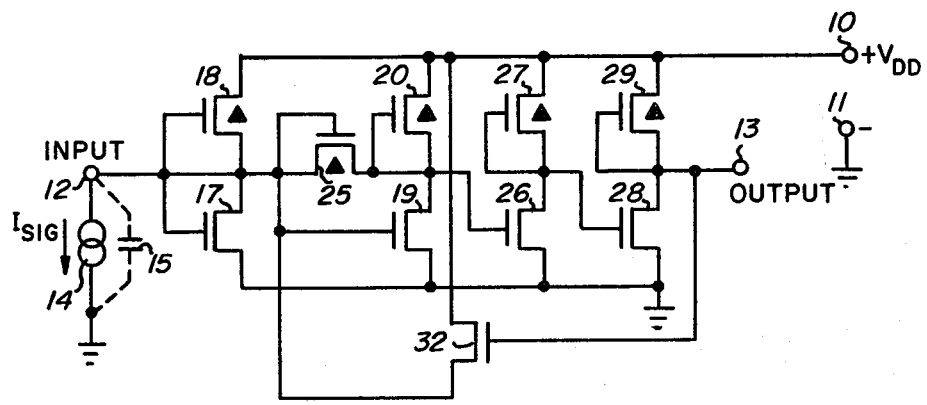
FIG. 3 is a schematic diagram of an alternative embodiment of the invention.

FIG. 3 is a schematic diagram of an alternative embodiment of the invention. Where the parts are similar to those of FIG. 2, the same numbers are used. Here, transistor 24 has been replaced by transistor 32 which has its drain returned to $+V_{DD}$ and its gate driven from output terminal 13. In effect, the source-drain circuit of transistor 32 is in parallel with depletion transistor 18. Since the source of transistor 32 is held at $V_{TRIP}$ by the action of transistors 17 and 18, for the logic "zero" state it will not conduct. However, for a logic "one", when output terminal rises over the level of $V_{TRIP}$ plus one enhancement transistor threshold, transistor 32 will turn on and the negative feedback will limit the voltage excursions.

While the illustrated embodiments shown represent the preferred embodiments, others will occur to a person skilled in the art upon reading the above description. For example, in FIG. 2 a second enhancement transistor could be coupled in series with transistor 24 to increase the output voltage swing. Accordingly, it is intended that the scope of the invention be limited only by the claims that follow.

I claim:

1. In a current sensing amplifier having an input terminal coupled to a memory element which is to have its memory content sensed and an output terminal which produces a voltage state indicative of said memory content, said amplifier comprising:

a first inverter gate made up of an inverting transistor and a load transistor, having its output shorted to its input so that it operates at its trip point, and coupled to said input terminal to reduce the voltage swings thereof;

a second inverter gate, made up of an inverting transistor and a load transistor, and having an input node coupled to said input terminal and an output node coupled to said output terminal; and first feedback means coupled between said second inverter gate input and output nodes; the improvement comprising;

a noninverting buffer amplifier coupled in cascade with said second inverter gate output node to drive said output terminal; and second feedback means coupled between said output terminal and said input terminal of said sensing amplifier.

2. The improvement of claim 1 wherein said second feedback means is output voltage sensitive and becomes effective when said output voltage rises above said first inverter trip point plus an enhancement transistor threshold.

3. The improvement of claim 2 wherein said second feedback means comprise a feedback enhancement transistor coupled between said output terminal and said input terminal.

4. The improvement of claim 3 wherein said feedback enhancement transistor has its drain and gate coupled to said output terminal and its source coupled to said input terminal.

5. The improvement of claim 3 wherein said feedback enhancement transistor has its drain returned to a fixed source of supply potential, its source coupled to said input terminal, and its gate coupled to said output terminal.

* * * * *